(12) United States Patent
Doerrer (10) Patent No.: US 7,119,608 B2
(45) Date of Patent: Oct. 10, 2006

(54) FORWARD-AMPLIFYING FILTER CIRCUIT

(75) Inventor: Lukas Doerrer, Villach (AT)

(73) Assignee: Infineon Technologies AG, Munich (DE)

( * ) Notice: Subject to any disclaimer, the term of this patent is extended or adjusted under 35 U.S.C. 154(b) by 5 days.

(21) Appl. No.: 10/926,549

(22) Filed: Aug. 26, 2004

(65) Prior Publication Data

US 2005/0052226 A1   Mar. 10, 2005

(30) Foreign Application Priority Data

Sep. 5, 2003   (DE)   ................ 103 41 063

(51) Int. Cl.
*H03K 5/00*   (2006.01)
*H03M 3/00*   (2006.01)
(52) U.S. Cl. ................ 327/552; 341/143
(58) Field of Classification Search ........ 327/552–559; 341/143, 150
See application file for complete search history.

(56) References Cited

U.S. PATENT DOCUMENTS

| 4,862,121 | A |   | 8/1989 | Hochschild et al. |
| 5,055,846 | A | * | 10/1991 | Welland ............ 341/155 |
| 5,392,042 | A | * | 2/1995 | Pellon ............ 341/143 |
| 6,414,615 | B1 |   | 7/2002 | Cheng |
| 6,573,790 | B1 | * | 6/2003 | Steensgaard-Madsen .... 330/107 |
| 6,670,902 | B1 | * | 12/2003 | Melanson et al. ......... 341/143 |
| 2002/0186776 | A1 |   | 12/2002 | Cosand |

OTHER PUBLICATIONS

Tietze, U.; Schenk, Ch.: Halbleiter-Schaltungstechnik, 10. Auflage, Berlin, Heidelberg, New York: Springer-Verlag, 1993, S. 416 and S. 438, ISBN 3-540-56184-6.
Van De Plassche, R.: "Intergrated Analog-to-Digital and Digital-to-Analog Converters," Boston, Dordrecht, London: Kluwer Academic Publishers, 1994, S. 432, ISBN 0-7923-9436-4.

* cited by examiner

*Primary Examiner*—Dinh T. Le
(74) *Attorney, Agent, or Firm*—Jenkins, Wilson, Taylor & Hunt, P.A.

(57) ABSTRACT

The invention relates to a forward-amplifying filter circuit which has an analogue filter with poles and zero points, having a first number of integrators which form the poles, which are arranged in series with one another and which each have an active component with a capacitance arranged in parallel therewith, having a second number of coefficients which form the zero points and which have at least one forward-amplifying path which contains a differentiating element, having a summing node whose input side is connected to the forward-amplifying paths of the zero points and whose output side is connected to the input of the last of the active components arranged in series. The invention also relates to an analog/digital converter circuit having such a filter circuit.

20 Claims, 8 Drawing Sheets

FORWARD-AMPLIFYING FILTER CIRCUIT

TECHNICAL FIELD

The invention relates to a filter circuit which has a forward-amplifying filter with poles and zero points. The invention also relates to an analog/digital converter circuit having such a filter circuit.

BACKGROUND ART

To produce various transfer functions, suitable filters are used. In this case, a distinction is drawn between active, i.e. analog, filters and digital filters. In the case of analog filter voltages, the processed signals are present in the form of continuous time functions. The functionality of an analog filter may also be provided in digital form. On account of the additional circuit complexity required for this and the fact that, particularly with a large number of data items to be processed, the analog/digital conversion and the digital/analog conversion are also time consuming, analog, continuous-time filters are used, particularly for very fast applications.

One special form of such an analog, continuous-time filter has a forward-amplifying architecture. Such forward-amplifying filter circuits, which are also frequently referred to as feedforward filters in technical literature, are known generally and are distinguished particularly by their performance. Forward-amplifying filter architectures are used particularly in telecommunications, for example in mobile radio and for broadband applications.

Figure 1:
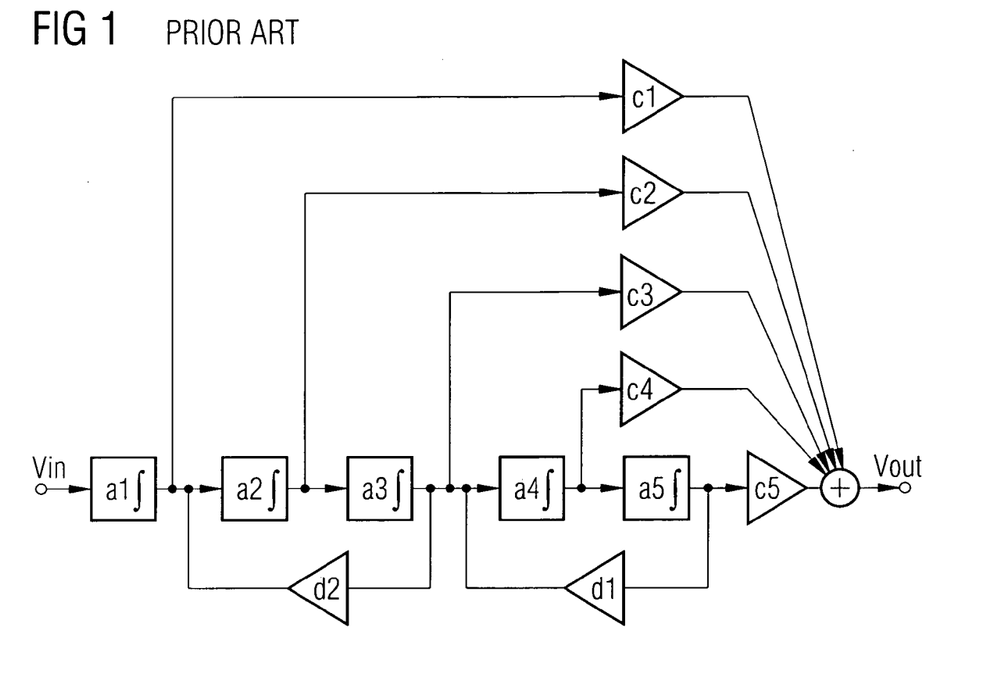
FIG. 1 uses a block diagram to show a general design for an analog forward-amplifying filter circuit.

FIG. 1 uses a schematic block diagram to show the general design of a fifth-order forward-amplifying filter circuit. Such a filter generally comprises poles and zero points, the poles being produced by integrators $a1$–$a5$ and the zero points being produced by coefficients $c1$–$c5$. The coefficients $c1$–$c5$ are formed by forward-amplifying paths in FIG. 1. In addition, feedback paths with coefficients $d1$, $d2$ are provided. At the output of the forward-amplifying filter circuit, there is a summing node, which means that an analog output signal Vout can be provided at the output from the analog input signal Vin which is input on the input side.

Figure 2:
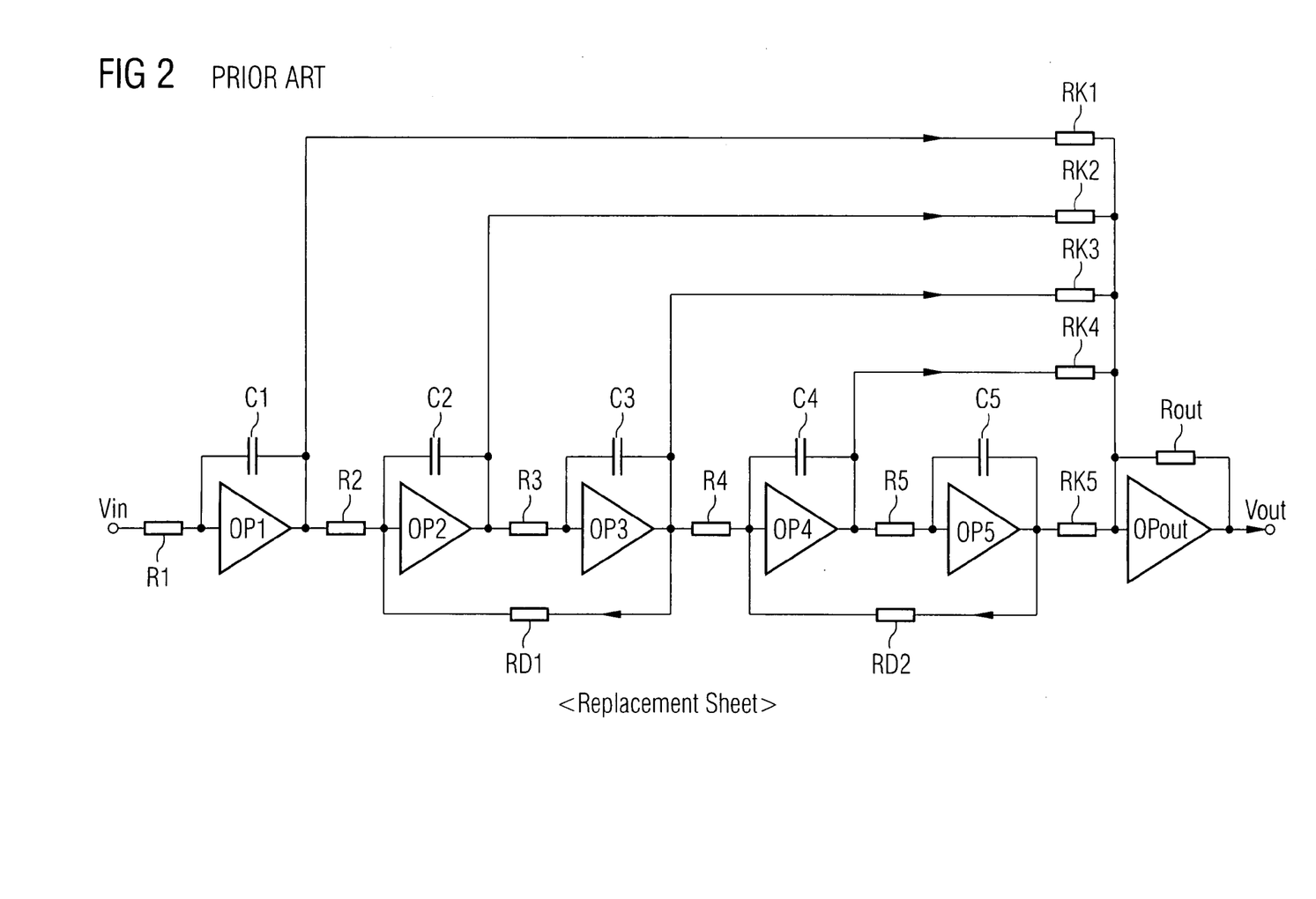
FIG. 2 shows a circuit diagram for a known forward-amplifying filter circuit with operational amplifiers, resistors and capacitances.

FIG. 2 shows a known circuit implementation for the forward-amplifying filter circuit from FIG. 1. In this case, the integrators $a1$–$a5$ have been produced by operational amplifiers OP1–OP5, resistors R1–R5 and capacitances C1–C5, and the feedforward coefficients $c1$–$c5$ have been produced by resistors RK1–RK5. To produce the summing node at the output of the filter circuit, however, an additional summing amplifier OPout with a parallel-connected resistor Rout is required. However, an additional operational amplifier OPout not only increases the power consumption of the overall filter circuit but also means an increase in execution time. Although it would also be possible to dispense with the summing amplifier OPout at the output of the filter circuit, the filter circuit would no longer operate in isolation in this case.

As an alternative to the implementation in FIG. 2, the integrators $a1$–$a5$ would also be able to be formed by transconductance amplifiers (OTA, voltage/current amplifiers), and the feedforward coefficients would be able to be formed by transconductance amplifiers or capacitances. The transconductance amplifiers or capacitances which such a filter circuit requires in the forward-amplifying paths are synonymous with nonlinear forward amplification, however, which means that use is preferably made of filter circuits in which the integrators are produced by operational amplifiers, resistors and capacitances, as shown in FIG. 2.

In such power-optimized filter circuits, the number of poles should be as equal as possible to the number of amplifying components.

SUMMARY OF THE INVENTION

The present invention is therefore based on the object of providing a forward-amplifying filter circuit which is optimized in terms of power. In particular, the filter circuit also needs to be optimized in terms of the propagation time between the filter circuit's input signal and output signal.

In line with the invention, at least one of these objects is achieved by a forward-amplifying filter circuit having the features of patent claim 1 and by an analog/digital converter circuit having the features of patent claim 13. Accordingly, the following are provided:

a forward-amplifying filter circuit which has an analog filter with poles and zero points, having a first number of integrators which form the poles, which are arranged in series with one another and which each have an active component with a capacitance arranged in parallel therewith, having a second number of coefficients which form the zero points and which have at least one forward-amplifying path which contains a differentiating element, having a summing node whose input side is connected to the forward-amplifying paths of the zero points and whose output side is connected to the input of the last of the active components arranged in series (patent claim 1).

an analog/digital converter circuit having a filter circuit as claimed in one of the preceding claims whose input side is connected to an input on the analog/digital converter circuit, having a quantizer whose input side is connected to an output on the filter circuit and whose output side is connected to the output of the analog/digital converter circuit, having a first feedback path which is arranged between the output and the input of the analog/digital converter circuit (patent claim 13).

The idea on which the present invention is based is to dispense with a dedicated operational amplifier provided for producing the summing node at the output of the filter circuit. The functionality of this summing node at the output is advantageously also fulfilled, as it were, by the operational amplifier which is associated with the last integrator. In this case, however, it is necessary to ensure that the forward-amplifying paths do not result in any kind of phase difference between the signals which are input into the input of the last operational amplifier. The invention is thus based on the insight that to avoid such a phase difference it is necessary for the zero points to be formed by differentiating elements in the feedforward paths. While a resistive feedforward architecture has the summing node at the output of the last integrator, the invention involves the summing in a feedforward architecture with differentiating elements now being performed at the input of the last integrator in the filter circuit.

In one very advantageous refinement, these differentiating elements for producing the zero points are in the form of capacitive elements, particularly in the form of capacitors. Hence, a capacitive feedforward network is obtained.

Dispensing with an operational amplifier provided specifically for summing means that chip area is saved, as it were. In addition, the filter circuit's power consumption is also reduced as a result. The filter propagation time is also shorter on account of the smaller number of amplifying elements, which means that faster filter circuits can be produced. A further advantage of the inventive filter circuit is primarily that filtering can take place in isolation, since the summing node is of low-impedance design.

The inventive capacitive feedforward circuit also has the advantage that, unlike a feedforward structure with transconductance amplifiers, a much better level of linearity in the passive components is attained, with a smaller chip area and lower power consumption.

Advantageous refinements and developments of the invention are the subject matter of the subclaims and also of the description with reference to the drawing.

The invention is explained in more detail below using the exemplary embodiments indicated in the schematic figures of the drawing, in which:

DETAILED DESCRIPTION OF THE INVENTION

In all of the figures of the drawing, elements, features and signals which are the same or have the same function have been provided—unless indicated otherwise—with identical reference symbols.

Figure 3:
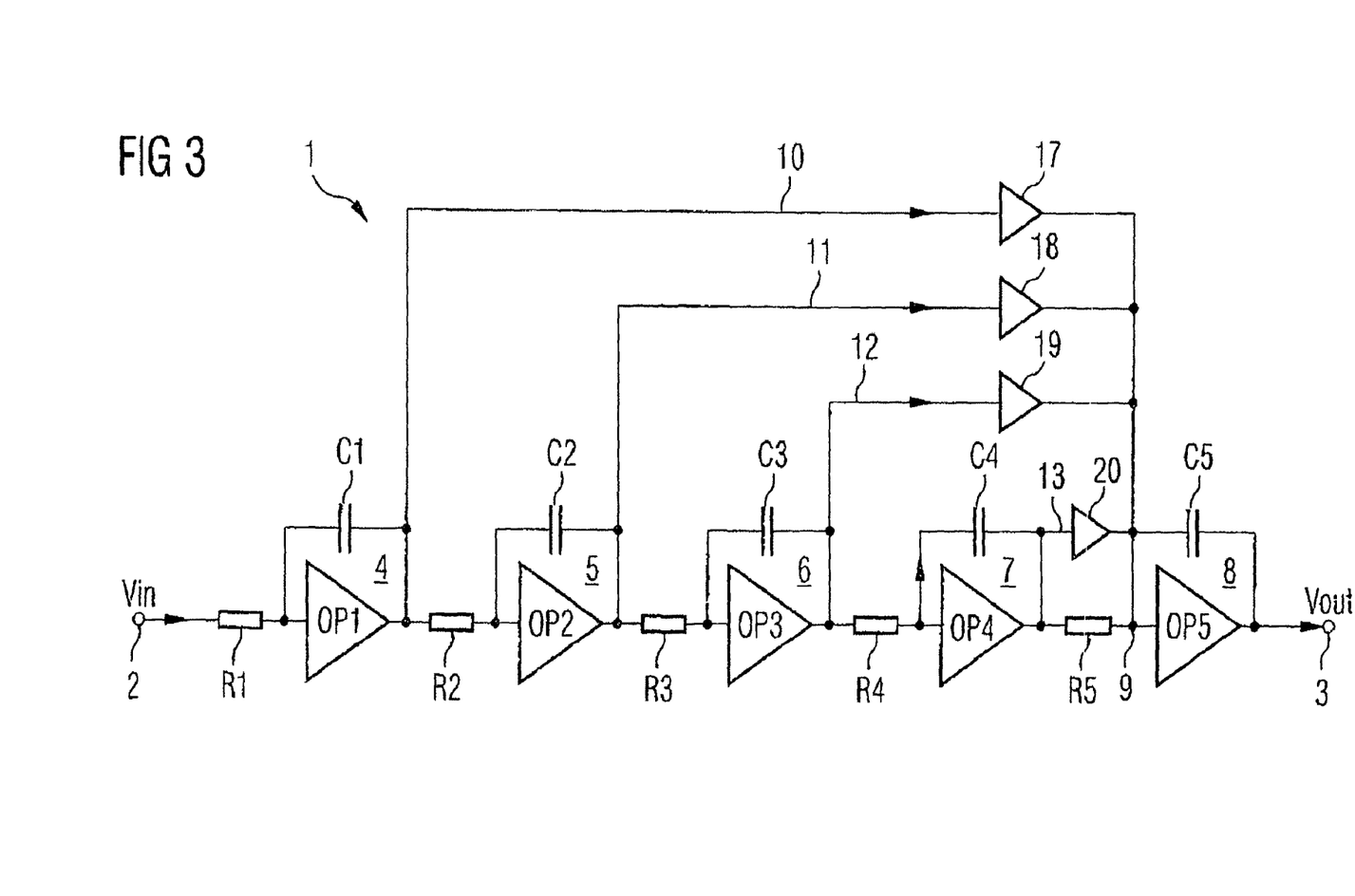
FIG. 3 uses a circuit diagram to show a first, generalized exemplary embodiment of a forward-amplifying filter circuit based on the invention.

FIG. 3 uses a circuit diagram to show a first generalized exemplary embodiment of a forward-amplifying filter circuit based on the invention. In FIG. 3, reference symbol 1 denotes the inventive filter circuit. In this case, the filter circuit 1 is in the form of an analog, forward-amplifying filter 1. The filter circuit 1 has an input 2, into which an analog input signal Vin can be input, and an output 3, from which an analog output signal Vout can be output.

The filter circuit 1 has five integrators 4–8 which are arranged between the input 2 and the output 3 and in series with one another. In the present exemplary embodiment, each integrator 4–8 comprises an operational amplifier OP1–OP5, each of which has a capacitive element C1–C5, for example a capacitor, connected in parallel with it.

An integrator 4–8 is thus to be understood to mean such components as integrate a signal which is input on the input side over time and provide the signal integrated over time on the output side. In automatic control engineering, the term integrator 4–8 denotes the case in which the output signal from the integrator is integrated with respect to the input signal to the integrator, that is to say that the relationship $$ua(t) = \int ue(\tau) d\tau$$

exists. The integrators 4–8 provided therefore need not necessarily be operational amplifiers OP1–OP5 with parallel-connected capacitances C1–C5. Rather, an integrator 4–8 may be produced by any desired combination of components which have said integrating functionality. The integrators 4–8 shown in FIG. 3 may either be in the form of clocked integrators (switched capacitor integrator) or in the form of continuous-time integrators. Such continuous-time integrators use resistors, capacitances and transconductances, for example.

For each integrator 4–8, a resistive element R1–R5, for example a resistor, is connected upstream of the parallel circuit comprising capacitive element C1–C5 and operational amplifier OP1–OP5. The respective resistive element R1–R5 thus forms an input and the output of the operational amplifier OP1–OP5 forms an output on a respective integrator 4–8. Identical numerals for the resistive elements R1–R5, capacitive elements C1–C5 and operational amplifiers OP1–OP5 are associated with a respective integrator 4–8 in this case.

The inventive filter circuit 1 also has four forward-amplifying paths 10–13 for producing the zero points. Each forward-amplifying path 10–13 contains a differentiating element 17–20, in line with the invention. A differentiating element 17–20 is designed to differentiate a signal which is input on the input side over time and to provide the differentiated signal on the output side. These differentiating elements 17–20, which thus form the feedforward coefficients of the forward-amplifying filter circuit 1, thus act as a differentiator. A respective forward-amplifying path 10–13 has its input side connected to a respective output on an integrator 4–7.

In the simplest case, these differentiating elements 17–20 are impedance ratios comprising a resistance, an inductance and a capacitance (RLC) or transconductances (gm stages) or, in the general case, combinations of impedances and active components, for example CMOS amplifiers. In this case, the feedforward loop using these differentiating elements 17–20 exhibits a differentiating behavior from the point of view of automatic control engineering. Differentiator thus means that the output signal from the differentiator (i.e. from the feedforward loop) is differentiated with respect to the input signal to the differentiator (i.e. to the feedforward loop), which means that the relationship $$ua(t) = \delta\, ue(\tau)/\delta\, dt$$

thus exists. If a feedforward loop is now connected up to a integrator in a chain, the transfer function is almost independent of frequency on account of the differentiation with subsequent integration. If two or more feedforward loops are now connected up to a node, the signals applied to the input of the feedforward loop are summed, in each case having been weighted with the coefficients of the feedforward loop. The particular advantage is now that introducing these differentiating elements 17–20 into the forward-amplifying paths 10–13 means that the summing node 9 is now arranged at the input of the last integrator OP5 instead of at the output of the last integrator, as is shown in FIG. 2. A summing amplifier connected downstream of this integrator 8 can advantageously be saved.

Figure 4:
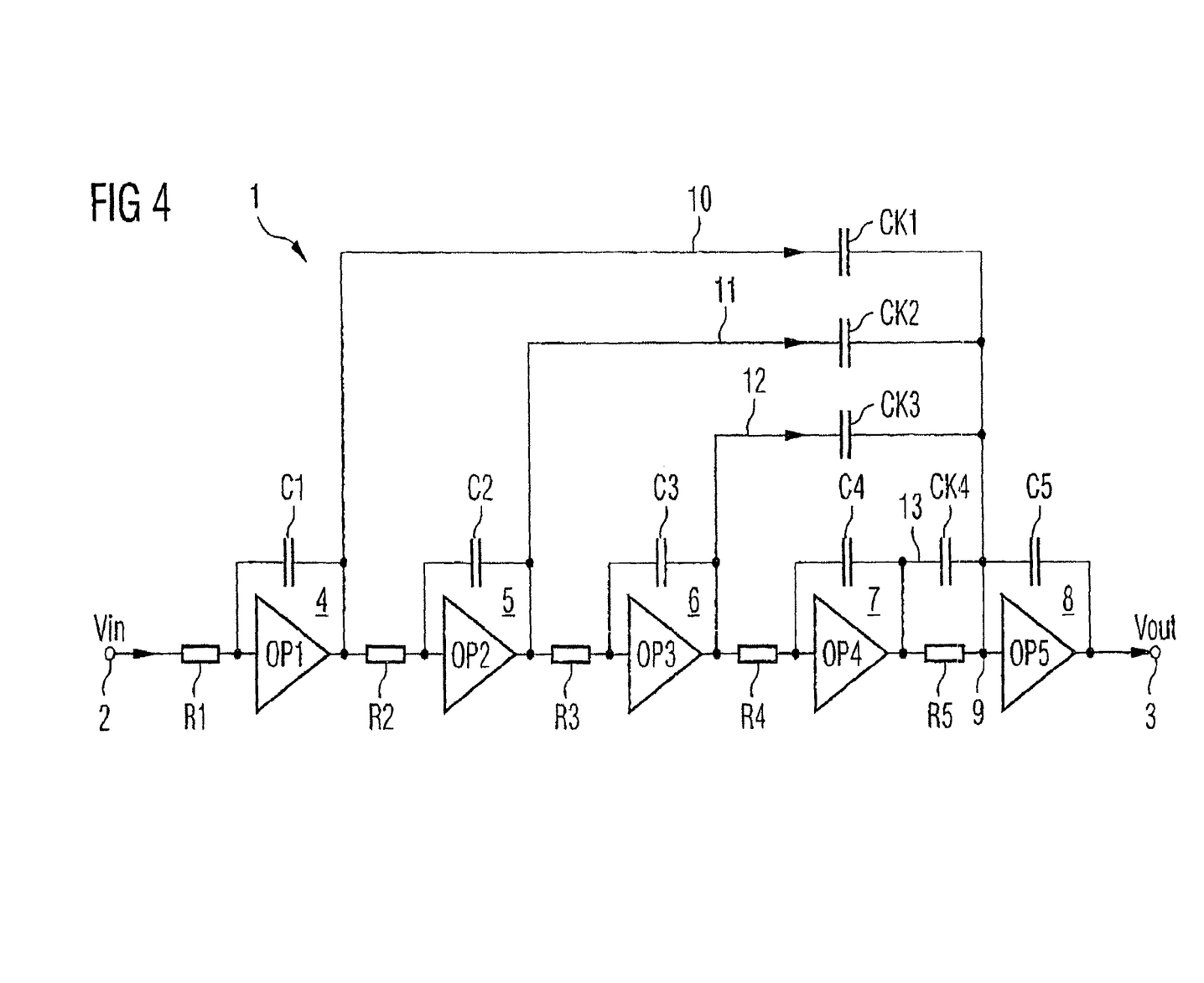
FIG. 4 uses a circuit diagram to show a second exemplary embodiment of a forward-amplifying filter circuit based on the invention.

FIG. 4 uses a circuit diagram to show a second exemplary embodiment of the inventive forward-amplifying filter circuit from FIG. 3. The differentiating elements 17–20, which are arranged in the forward-amplifying paths 10–13, are in this case in the form of capacitive elements CK1–CK4, for example in the form of capacitors.

The inventive filter circuit 1 also has a summing node 9. The output side of the forward-amplifying paths 10–13 is likewise connected to the summing node 9. The summing node 9 is arranged at the input of the last integrator 8, specifically between the resistor R5 and the parallel circuit comprising operational amplifier OP5 and capacitive element C5.

Figure 5:
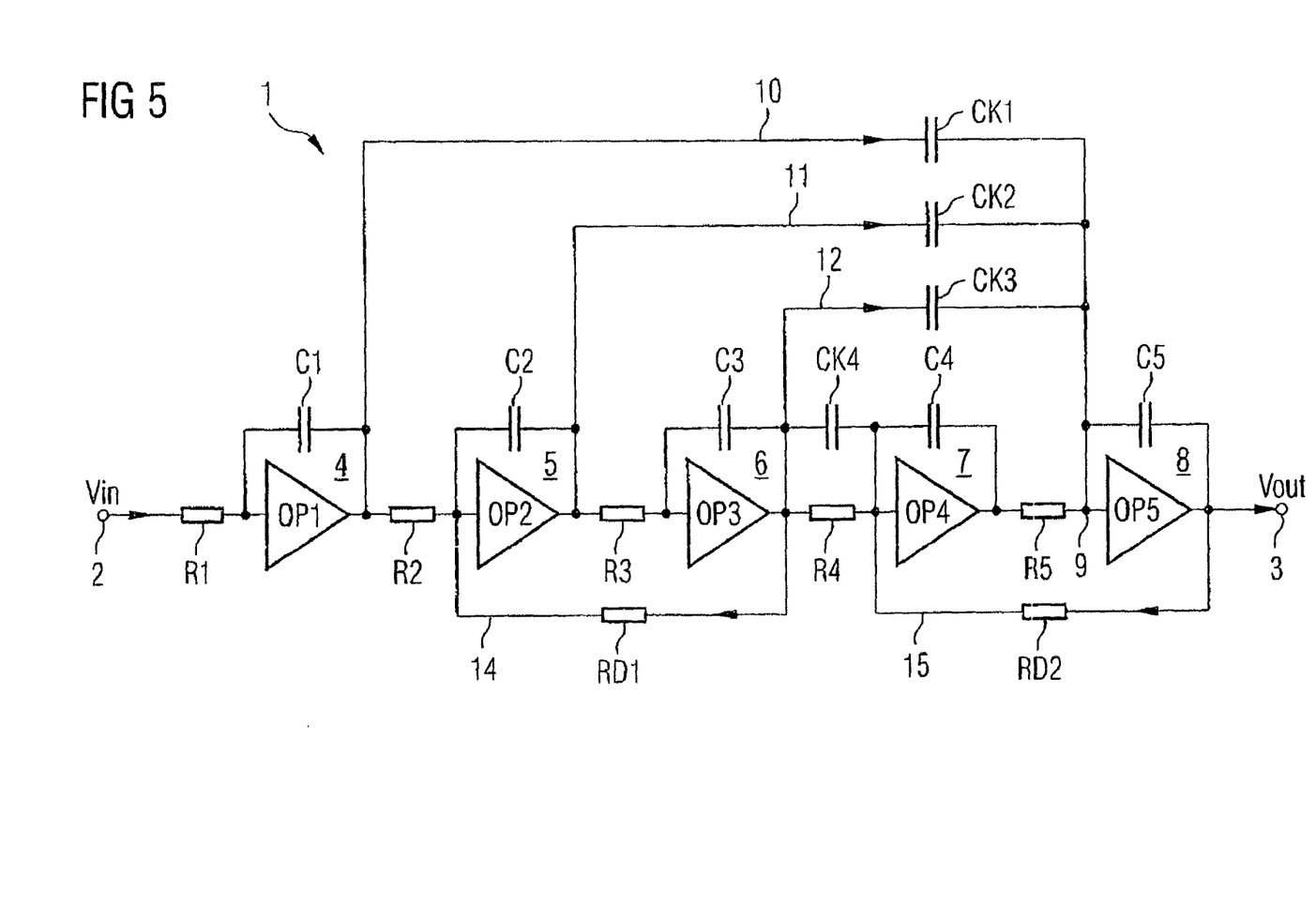
FIG. 5 uses a circuit diagram to show a third exemplary embodiment of a forward-amplifying filter circuit based on the invention.

FIG. 5 shows a third exemplary embodiment of the inventive forward-amplifying filter circuit. Unlike in the exemplary embodiments in FIGS. 3 and 4, the capacitive element CK4 in the fourth forward-amplifying path 13 in FIG. 5 is arranged in parallel with the resistor R4 in the fourth integrator 7. This achieves the same effect as when the capacitive element CK4 is connected in parallel with the resistive element R5, and the feedback path 15 is dispensed with (as is the case in FIG. 4).

In addition, two further feedback paths 14, 15 are provided which each contain a resistive element RD1, RD2. By way of example, the resistive elements RD1, RD2 may be in the form of switched capacitances which act as resistors. Each of these resistive elements RD1, RD2 brings about a phase shift through 180° together with the subtraction at the corresponding node. Feeding back the output signal Vout with a 180° phase shift (in combination with the integrators) results in a local resonator (360°), which significantly raises the signal-to-noise ratio (SNR) for the entire filter circuit 1. This can be implemented only if a respective resistive element RD1, RD2 is arranged in parallel with two phase-shifting amplifiers, for example two operational amplifiers. For this reason, the two paths 14, 15 are each connected in parallel with two operational amplifiers OP2–OP5. In the present example, the path 14 is connected in parallel with the operational amplifiers OP2, OP3, and the path 15 is connected in parallel with the operational amplifiers OP4, OP5.

The text below describes the way in which the inventive filter circuit 1 shown in FIGS. 4 and 5 works.

When an analog input signal Vin is input, this signal is integrated using the successively arranged integrators 4–7 and is supplied to the summing node 9 at the output. In addition, the integrated output signal from a respective integrator 4–7 is filtered using the capacitive elements CK1–CK4 in the forward-amplifying paths 10–13 and is likewise supplied to the summing node 9. In this case, the capacitances CK1–CK4 in the forward-amplifying paths 10–13 bring about a respective phase rotation. The advantage in this is that it allows the output signals from the forward-amplifying paths 10–13 to be input into the input of the operational amplifier OP5, resulting in the performance of a summing operation. The output signal from the operational amplifier OP5 is thus the summed signal which is provided as the output signal Vout at the output 3. This is possible because a respective capacitive element CK1–CK4 in forward-amplifying paths 10–13 forms a parallel circuit with the capacitance C5 which is connected in parallel with the operational amplifier OP5 in the last integrator 8. The result is thus a respective capacitive voltage divider which, in the case of the forward-amplifying path 10, is formed from the capacitance CK1 and the capacitance C5. A purely capacitive voltage divider now causes no phase difference to exist between the two signals, which means that it is possible for the first time to sum the signals at the input of the operational amplifier OP5.

The way in which the inventive filter circuit 1 works has been described above specifically with reference to the exemplary embodiments in FIGS. 4 and 5 using the capacitive elements CK1–CK4 which are in the form of capacitors. At this point, however, it should be noted that instead of using capacitors CK1–CK4 it is naturally possible to use any differentiating elements, as is shown in the exemplary embodiment in FIG. 3.

Figure 6:
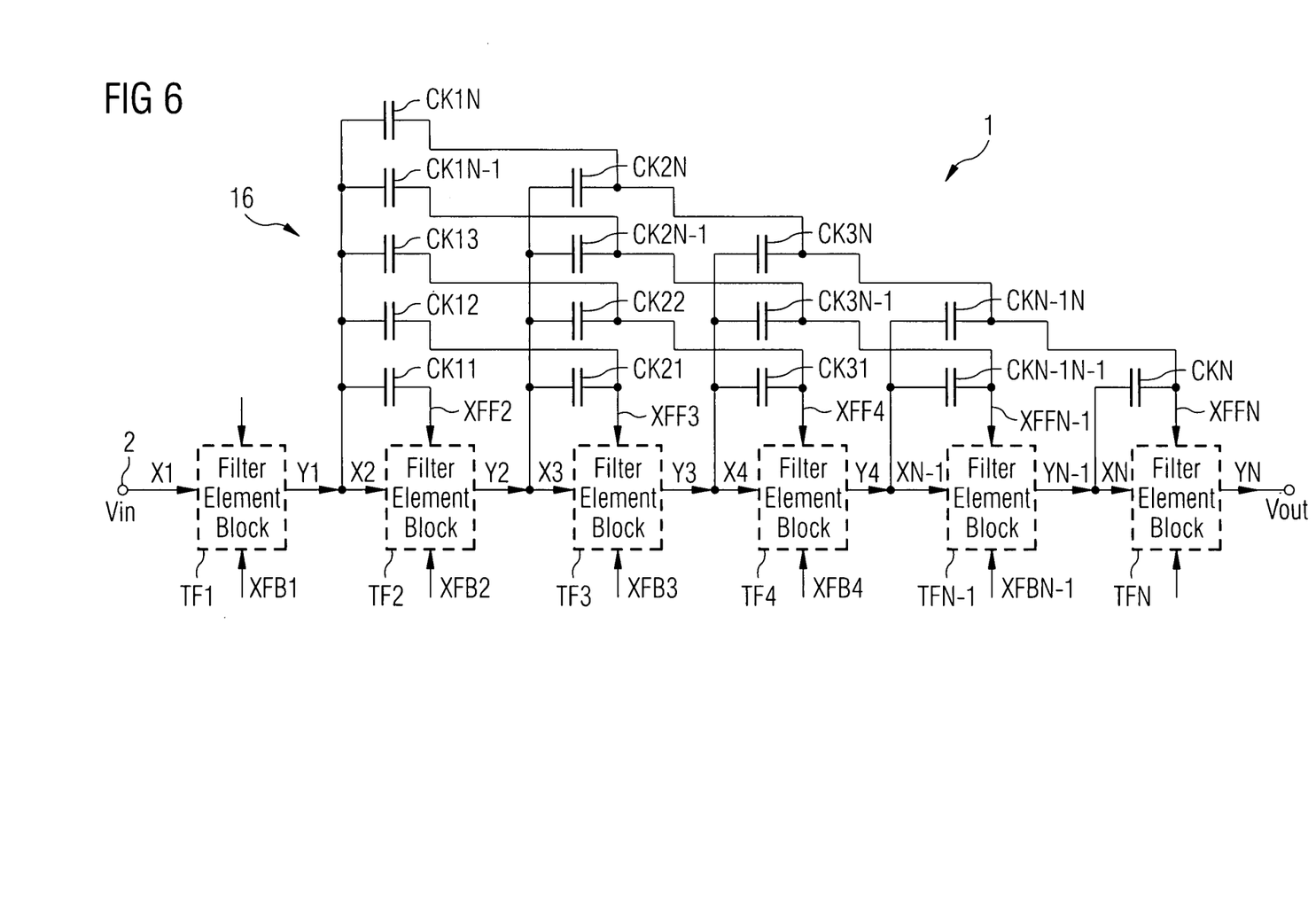
FIG. 6 uses a block diagram to show the general design of a forward-amplifying filter circuit based on the invention with filter element blocks.

FIG. 6 shows a highly generalized illustration of a forward-amplifying filter circuit 1 based on the invention. The filter circuit 1 has N filter element blocks TF1–TFN whose inputs and outputs are connected in series and which are arranged between the input 2 and the output 3 of the filter circuit 1. The output signal Yi (where i=1 . . . N) from a respective filter element block TFi forms the input signal Xi+1, as it were, to the downstream filter element block TFi+1.

In addition, the invention provides a capacitive network 16 which, in particular, forms the zero points of the filter circuit 1. The capacitive network 16 comprises a multiplicity of feedforward coupling elements CKij (where j=2 . . . N). The two indices i and j denote those filter element blocks TFi between which the respective capacitive element CKij is arranged. In this case, the index i denotes the output of the respective filter element block TFi, and the index j denotes the feedforward input of the downstream filter element block TFj, which have the respective coupling element CKij arranged between them. In the present exemplary embodiment, the feedforward coupling elements CKij are in the form of capacitances (C11, C12, . . . C1N−1, C1N, C21, . . . CNN−1, CNN). The capacitive network 16 can be used to produce virtually any desired feedforward coupling from the output Yi of the ith filter element block TFi to the feedforward input XFFj of any desired downstream jth filter element block TFj (where j>i).

It goes without saying that it is not necessary to fit components to all of the feedforward capacitances CKij in the capacitive network 16. Rather, depending on requirements, it may be stipulated which of these feedforward capacitances CKij is/are used and what the capacitance value of this capacitance used is.

In a further refinement, there may also be feedback from the output Yj of the jth filter element block TFj to a feedback input XFBi on the ith filter element block TFi. The corresponding feedback elements may either be capacitive or resistive, for example in the form of capacitances or resistors.

In FIG. 6, the capacitive network 16 is produced by providing feedforward coupling elements which are in the form of capacitive elements CKij. It goes without saying that, in a similar manner to in the exemplary embodiment described with reference to FIG. 3, these feedforward coupling elements CKij may generally be in the form of differentiating elements. Each capacitive element CKij can thus be replaced as a respective differentiator which differentiates the input signal over time and provides the signal differentiated over time on the output side.

Figure 7:
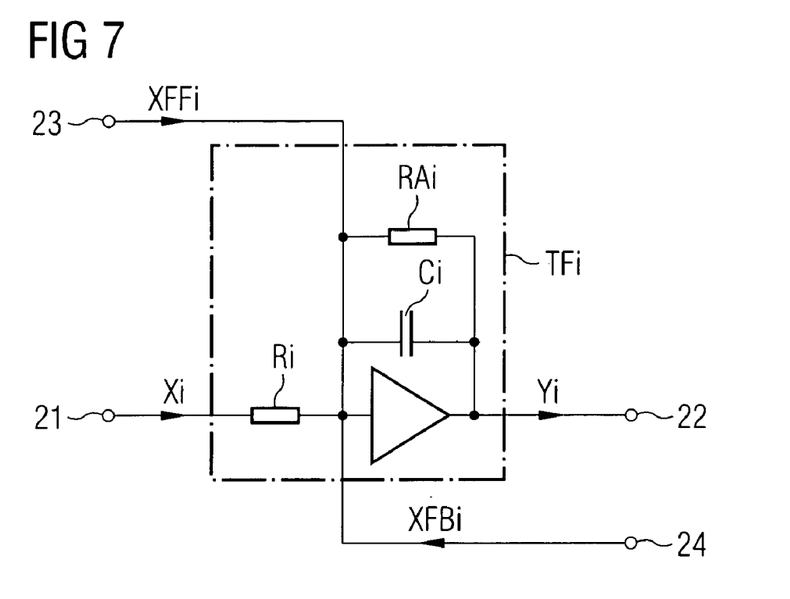
FIG. 7 shows a circuit diagram of an individual filter element block for a forward-amplifying filter circuit based on the invention as shown in FIG. 6.

FIG. 7 uses a circuit diagram to show the implementation of a filter element block TFi in the filter circuit 1 from FIG. 6. The filter element block TFi forms an arbitrary integrator. A respective filter element block TFi has an input 21, into which an input signal Xi is input, and an output 22, at which an output signal Yi can be tapped off. In addition, the filter element block TFi contains two further input connections 23, 24. The input 23 can be used to input a (forward-coupled) signal XFFi, and the input 24 can be used to input a (backward-coupled) signal XFBi. The input connection 23 can be used to connect the filter element block TFi to the capacitive network 16 and hence to feedforward coupling capacitances CKij. The input 24 can be used to connect the filter element block TFi to a feedback path or to a feedback network.

A respective filter element block TFi or integrator may have, on the input side, a resistor element Ri which has a parallel circuit comprising an operational amplifier OPi, a capacitance Ci and a resistor element RAi connected downstream of it. The resistive elements Ri, RAi and the capacitive element Ci may be produced by resistors and capacitances. Alternatively, these elements may also be formed by a switched transistor.

It goes without saying that a filter element block TFi or an integrator block does not necessarily need to have all of the impedances Ri, RAi, Ci. Thus, by way of example, it is also possible to dispense with the resistor RAi or the capacitance Ci in the case of two or more filter element blocks TFi being connected in a chain. It is fundamental that an integrator block has at least one input resistor Ri and operational amplifier OPi.

Figure 8:
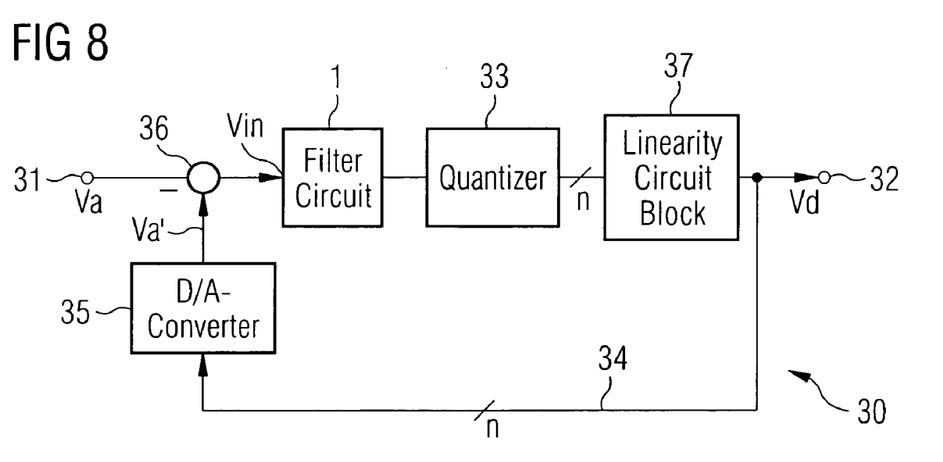
FIG. 8 shows a block diagram of a sigma-delta A/D converter based on the invention with the inventive filter circuit.

One particularly preferred example of application of the inventive filter circuit is indicated in FIG. 8. FIG. 8 shows a block diagram of a sigma-delta analog/digital converter (A/D converter), which is denoted by reference symbol 30. The A/D converter 30 has an input 31 and an output 32. An analog input signal Va is input into the input 31. Following appropriate analog/digital conversion, the A/D converter produces a digital output signal Vd which can be tapped off at the output 32. The AD converter 30 has a filter circuit 1 based on the invention which is connected to the input 31. Arranged between the output of the filter circuit 1 and the output 32 is a quantizer 33 which converts the filter output signal into a digital signal Vd. In addition, the output 32 and the input 31 have a feedback path 34 between them which contains a digital/analog converter 35 (D/A converter). The D/A converter 35 converts the digital output signal Vd into an analog signal Va' which is subtracted from the analog input signal Va in a subtraction device 36 at the input 31.

Between the quantizer 33 and the output 32 there may additionally be a circuit block 37 which is used to improve the linearity of the D/A converter 35 and, to this end, dynamically matches the input signal Va and the output signal Vd to one another.

Figure 9:
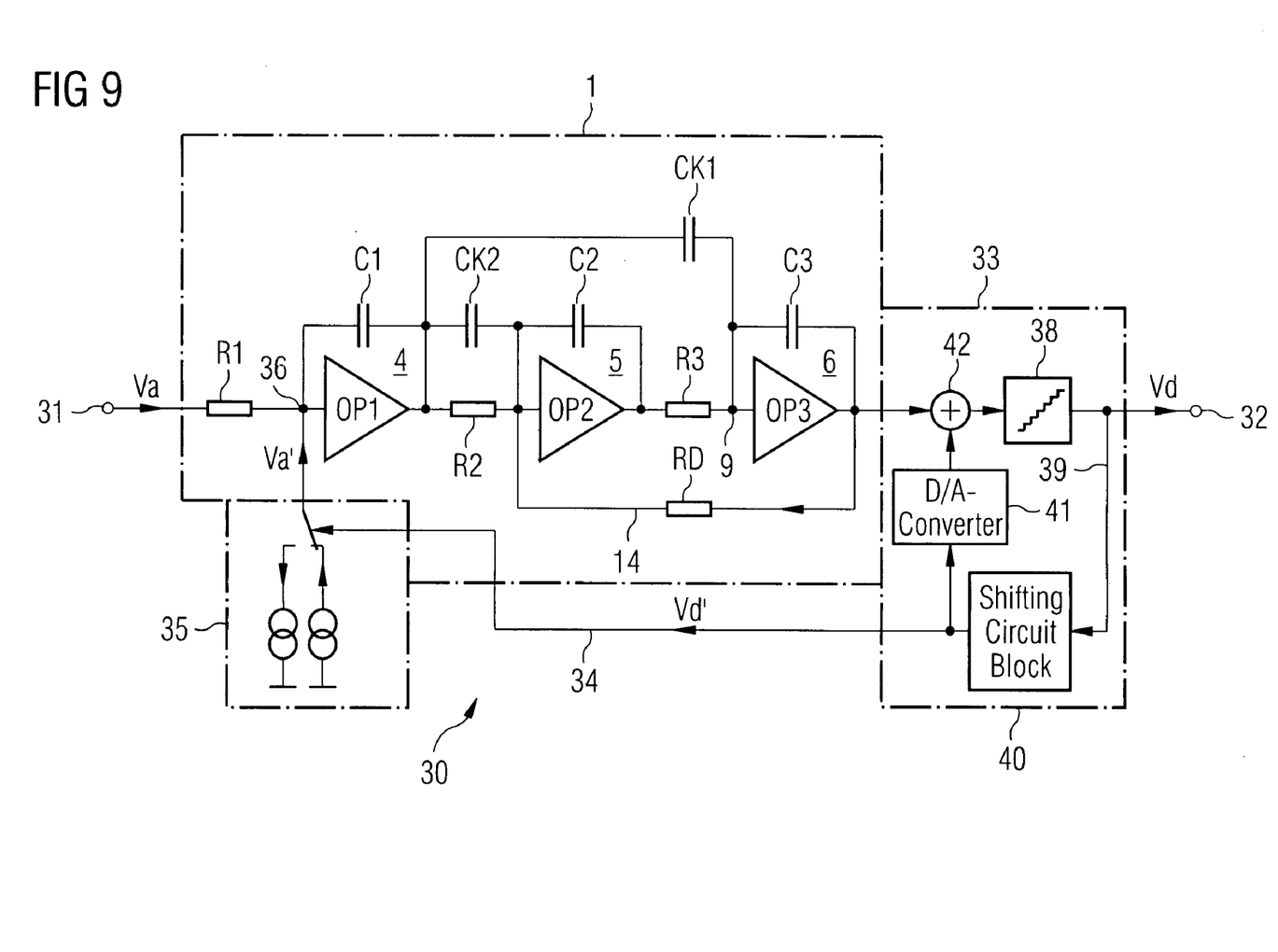
FIG. 9 shows a detailed circuit diagram of a sigma-delta A/D converter based on the invention as shown in FIG. 8.

FIG. 9 uses a detailed circuit diagram to show an implementation of the sigma-delta A/D converter from FIG. 8 which is advantageous in terms of circuitry. In this case, the filter circuit 1 contains three integrators 4–6, the summing node 9 being arranged at the input of the last integrator 6. A respective integrator 4–6 has operational amplifiers OP1–OP3, series resistors R1–R3 and capacitances C1–C3. In addition, the filter circuit 1 contains a capacitively designed feedforward coupling with the coupling elements CK1, CK2. There is also a feedback path 14 with the resistor element RD, which is arranged in parallel with the last two operational amplifiers OP2, OP3.

In the present exemplary embodiment, the quantizer 33 contains an A/D converter 38, which may be in the form of a flash A/D converter 38, for example. A feedback branch 39 for the quantizer 33 contains a circuit block 40 which may be used, in the present case, to produce a shift through one half of a clock cycle of the digital output signal Vd. This output signal Vd' delayed by half a clock cycle is supplied firstly to the DA converter 35 and secondly to a further DA converter 41, which is part of the quantizer 33. In the present exemplary embodiment, the DA converters 35, 41 are in the form of 3-bit DA converters and may be produced as switchable current sources, for example. The analog output signal from the DA converter 41 is overlaid with the filter output signal from the filter circuit 1 in a summing device 42.

Although the present invention has been described above with reference to a preferred exemplary embodiment, it is not limited thereto but may be modified in a wide variety of ways.

For example, the present exemplary embodiments have described a filter circuit based on the invention with five integrators and four coefficients, but the invention is not limited to this number of integrators and coefficients. Rather, a filter circuit based on the invention may also have more or fewer integrators (poles) and coefficients (zero points), given suitable adaptation and depending on the desired application.

In the present exemplary embodiments, the capacitive elements and resistive elements are also formed by capacitances (capacitors) and resistors. It goes without saying that these elements may naturally also be produced in another way, for example by transistors or the like.

In the present exemplary embodiments, a resistor with a downstream operational amplifier is also provided for an integrator. It would naturally be conceivable to have any other amplifier circuit whose input has a voltage or a potential applied to it which is amplified and can be tapped off at the output as an amplified output potential or output voltage.

Although the differentiating elements in the feedforward paths in the exemplary embodiments above are, for the most part, formed by capacitive elements, for example capacitors, they are not limited thereto. At this point it will again be emphasized that the functionality of these differentiating elements can be replaced by all such components or combinations of components as have said differentiating functionality, that is to say as integrate a signal over time.

It will also be emphasized at this point that the inventive filter circuit is also capable of functioning without a feedback path or feedback network. Depending on requirements or application, these feedback elements may be used in suitable fashion with the inventive capacitive feedforward coupling and may thus bring about a suitable transfer function for the filter circuit with the desired linearity.

All of the circuit arrangements in the present exemplary embodiments have been indicated as "single-ended circuits". In one preferred circuit implementation, they may be in the form of differential circuits generally, however. This has not been shown in the figures for reasons of better clarity, however.

It goes without saying that the inventive filter circuit is not necessarily limited to an application for an analog/digital converter, particularly a sigma-delta A/D converter. Rather, the inventive filter circuit may naturally be used for any applications which require a power-optimized filter based on the invention.

LIST OF REFERENCE SYMBOLS

1 Filter circuit
2 Input on the filter circuit
3 Output on the filter circuit
4–8 Integrators
9 Summing node
10–13 (Forward-amplifying) paths
14, 15 Feedback paths
16 Capacitive network
17–20 Differentiating elements
21 (Integrator) input 22 (Integrator) output
23 (Feedforward) input
24 (Feedback) input
30 Sigma-delta A/D converter
31 Input on the A/D converter
32 Output on the A/D converter
33 Quantizer
34 Feedback path
35 D/A converter
36 Subtraction device
37 Circuit block
38 A/D converter
39 Feedback path
40 Circuit block for shifting through one half of a clock cycle
41 D/A converter
42 Summing device, summing amplifier
a1–a5 Integrators, poles
c1–c5 (Feedforward) coefficients, zero points
Ci, C1–C5 Capacitances in the integrators
CKi, CK1–CK5 Feedforward capacitances
CKij Feedforward capacitances
d1, d2 Feedback coefficients
Opi, OPi–OP5 Operational amplifiers (for the integrators)
Opout Summing amplifier
RAi Resistor for an integrator
RD, RD1, RD2 Resistive elements in the feedback path
Ri, R1–R5 Resistors for the integrators
RK1–RK5 Resistors for the zero points
Rout Output resistor
Va Analog input signal
Va' Fed back analog output signal
Vd Digital output signal
Vd' Fed back digital output signal
Vin Input voltage, input signal
Vout Output voltage, output signal
XFBi Feedback input signal for an integrator block
XFFi Feedforward input signal for an integrator block
Xi Input signal for a filter element block/integrator block
Yi Output signal from a filter element block/integrator block

What is claimed is:

1. A forward-amplifying filter circuit which has an analog filter having poles and zero points, having:
    (a) an input terminal for inputting an input signal;
    (b) a first number of integrators which form the poles of the analog filter, which are connected in series with one another and which each have an active component with a capacitance arranged in parallel therewith;
    (c) a second number of coefficients which form the zero points of the analog filter and which have at least one forward-amplifying path which contains a differentiating element;
    (d) a summing node being connected to the forward-amplifying paths of the zero points and being also connected to the input of the last of the active components arranged in series with one another; and
    (e) an output terminal for outputting an output signal, the output terminal being connected with the output of the last of the active components.

2. The filter circuit as claimed in claim 1, wherein the filter is a continuous-time forward-amplifying filter.

3. The filter circuit as claimed in claim 1, wherein at least one of the differentiating elements is a capacitive element.

4. The filter circuit as claimed in claim 1, wherein at least one of the active components is an operational amplifier.

5. The filter circuit as claimed in claim 1, wherein the first number is equal to the second number.

6. The filter circuit as claimed in claim 1, wherein the first number is equal to a total number of active components within the filter circuit.

7. The filter circuit as claimed in claim 1, wherein at least one of the active components has a first resistive element, particularly a resistor, arranged upstream of its input side.

8. The filter circuit as claimed in claim 7, wherein at least one coupling capacitance is provided which is arranged in parallel with at least one of the first resistive elements.

9. The filter circuit as claimed in claim 1, wherein a resistive element, particularly a resistor, is arranged in parallel with at least one of the capacitances.

10. The filter circuit as claimed in claim 1, wherein a network is provided which has a multiplicity of forward-amplifying paths, with a respective input on one of these forward-amplifying paths being connected to the output of a first one of the active components, and an output on the corresponding forward-amplifying path being connected to an input on a second one of the active components, which is connected downstream in series with the first one of the active components.

11. The filter circuit as claimed in claim 1, wherein at least one feedback path is provided which feeds back a signal at the output of a second one of the active components to an input of a first one of the active components, which is connected upstream in series with the second one of the active components.

12. The filter circuit as claimed in claim 11, wherein the elements in the feedback path are resistive elements.

13. An analog/digital converter circuit having:
    (a) a filter circuit as claimed in claim 1 whose input side is connected to an input of the analog/digital converter circuit;
    (b) a quantizer whose input side is connected to an output of the filter circuit and whose output side is connected to the output of the analog/digital converter circuit; and
    (c) a first feedback path arranged between the output and the input of the analog/digital converter circuit.

14. The converter circuit as claimed in claim 13, wherein the analog/digital converter circuit is a sigma-delta analog/digital converter.

15. The converter circuit as claimed in claim 13, wherein a first digital/analog converter is provided which is arranged in the first feedback path.

16. The converter circuit as claimed in claim 13, wherein the quantizer has a comparator.

17. The converter circuit as claimed in claim 13, wherein the quantizer has a flash analog/digital converter.

18. The converter circuit as claimed in claim 15, wherein a second feedback path is provided which supplies an output signal from the flash analog/digital converter, shifted through half a clock cycle, to a second digital/analog converter, whose output signal is summed with the output signal from the filter circuit and is supplied to the flash analog/digital converter.

19. The converter circuit as claimed in claim 13, wherein the quantizer and the output of the analog/digital converter circuit have a circuit device provided between them which improves the linearity of the digital/analog converter by matching the digital output signal to the analog input signal.

20. The converter circuit as claimed in claim 15, wherein at least one of the digital/analog converters has at least one switchable current source.

* * * * *